(12) United States Patent
Teng

(10) Patent No.: US 11,929,764 B2
(45) Date of Patent: *Mar. 12, 2024

(54) ENCODER AND FLASH MEMORY CONTROLLER

(71) Applicant: Silicon Motion, Inc., Hsinchu County (TW)

(72) Inventor: Duen-Yih Teng, Taoyuan (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/945,110

(22) Filed: Sep. 15, 2022

(65) Prior Publication Data

US 2023/0412194 A1 Dec. 21, 2023

(30) Foreign Application Priority Data

Jun. 16, 2022 (TW) .................................. 111122323

(51) Int. Cl.
*H03M 13/11* (2006.01)
*H03M 13/00* (2006.01)
*H03M 13/15* (2006.01)

(52) U.S. Cl.
CPC ..... *H03M 13/118* (2013.01); *H03M 13/1575* (2013.01); *H03M 13/611* (2013.01); *H03M 13/1174* (2013.01); *H03M 13/658* (2013.01)

(58) Field of Classification Search
CPC ........... H03M 13/118; H03M 13/1575; H03M 13/611
See application file for complete search history.

(56) References Cited

U.S. PATENT DOCUMENTS

| 10,523,243 | B2 * | 12/2019 | Kuo | ...................... H03M 13/611 |
| 10,958,292 | B2 * | 3/2021 | Kuo | ...................... H03M 13/116 |
| 2010/0251059 | A1 * | 9/2010 | Dielissen | ........... H03M 13/1168 714/752 |
| 2019/0044537 | A1 * | 2/2019 | Reynwar | ............ H03M 13/1137 |
| 2019/0165817 | A1 * | 5/2019 | Kuo | .................. H03M 13/2933 |
| 2022/0069844 | A1 * | 3/2022 | Namboodiri | ......... H03M 13/611 |

FOREIGN PATENT DOCUMENTS

| TW | I487290 B | 6/2015 |
| TW | I665678 B | 7/2019 |

* cited by examiner

*Primary Examiner* — Joseph D Torres
(74) *Attorney, Agent, or Firm* — Winston Hsu

(57) ABSTRACT

For an encoder for use in a flash memory controller, partial parity blocks generated in the encoder are divided into two parts for further operations, wherein a number of partial parity block(s) of the first part generated earlier is less than a number of partial parity block(s) of the second part. The encoder can reduce the hardware required for the circulant convolution calculation in the encoder, and has high efficiency. In addition, by converting a parity-check matrix to generate an isomorphic matrix, some components in the encoder and the decoder can be further omitted, so as to further reduce the manufacturing cost.

2 Claims, 7 Drawing Sheets

$$\begin{bmatrix} \sigma^{136} & \sigma^{158} & \sigma^{172} & \sigma^{98} & \sigma^{84} \\ \sigma^{45} & \sigma^{136} & \sigma^{158} & \sigma^{172} & \sigma^{198} \\ \sigma^{73} & \sigma^{45} & \sigma^{136} & \sigma^{158} & \sigma^{172} \\ \sigma^{190} & \sigma^{73} & \sigma^{45} & \sigma^{136} & \sigma^{158} \\ \sigma^{8} & \sigma^{190} & \sigma^{73} & \sigma^{45} & \sigma^{136} \end{bmatrix} \cong \begin{bmatrix} \sigma^{0} & \sigma^{0} & \sigma^{0} & \sigma^{0} & \sigma^{0} \\ \sigma^{0} & \sigma^{S_{00}} & \sigma^{S_{01}} & \sigma^{S_{02}} & \sigma^{S_{03}} \\ \sigma^{0} & \sigma^{S_{10}} & \sigma^{S_{11}} & \sigma^{S_{12}} & \sigma^{S_{13}} \\ \sigma^{0} & \sigma^{S_{20}} & \sigma^{S_{21}} & \sigma^{S_{22}} & \sigma^{S_{23}} \\ \sigma^{0} & \sigma^{S_{30}} & \sigma^{S_{31}} & \sigma^{S_{32}} & \sigma^{S_{33}} \end{bmatrix}$$

FIG. 5

ENCODER AND FLASH MEMORY CONTROLLER

BACKGROUND OF THE INVENTION

1. Field of the Invention

The present invention is related to an encoder, and more particularly, to an encoder that is applied in a flash memory controller.

2. Description of the Prior Art

A typical encoder will have a parity-check matrix for checking whether a parity generated by the encoder is correct. For example, after the encoder encodes data to generate the parity, the data and the parity will be multiplied by the parity-check matrix, to generate a multiplication result. If the multiplication result is equal to "0", it is determined that the encoding is correct; and if the multiplication result is not equal to "0", it is determined that the encoding is incorrect. In response to the parity-check matrix, the encoder will have a corresponding parity-generation matrix for generating appropriate parity. Under some conditions, however, the parity-generation matrix may not be found out, and the encoder will need to perform multiple matrix multiplication operations, compensation operations, and/or adjustment operations to generate parity that is similar to the parity generated by utilizing the parity-generation matrix, which will increase complexity of the encoder. Specially, the above-mentioned multiple matrix multiplication operations usually include circulant convolution calculation, which will greatly increase hardware cost of the encoder.

SUMMARY OF THE INVENTION

It is therefore one of the objectives of the present invention to provide an encoder that can reduce hardware required by circulant convolution calculation in the encoder, to avoid the situation that the hardware cost is increased greatly as mentioned in above description of the prior art.

According to an embodiment of the present invention, an encoder is provided. The encoder includes a first barrel shifter module, a first calculation circuit, an adjustment circuit, a first circulant convolution calculation circuit, and a second calculation circuit. The first barrel shifter module is arranged to process multiple data blocks to sequentially generate multiple partial parity blocks, wherein the multiple partial parity blocks comprise a first part and a second part, generation time of the first part is earlier than generation time of the second part, and a number of partial parity blocks comprised in the first part is less than a number of partial parity blocks comprised in the second part. The first calculation circuit is coupled to the first barrel shifter module, and is arranged to generate a first calculation result according to the second part. The adjustment circuit is arranged to adjust the first part of the multiple partial parity blocks according to the first calculation result, to generate an adjusted first part. The first circulant convolution calculation circuit is coupled to the adjustment circuit, and is arranged to perform a circulant convolution operation upon the adjusted first part, to generate a first part parity block. The second calculation circuit, coupled to the first circulant convolution calculation circuit, and arranged to generate a second part parity block according to the first part parity block, wherein the first part parity block and the second part parity block act as multiple parity blocks that are generated by the encoder for the multiple data blocks, and the multiple data blocks and the multiple parity blocks are written into a flash memory module.

According to an embodiment of the present invention, a flash memory controller is provided. The flash memory controller is arranged to access a flash memory module, and includes a memory, a microprocessor, and an encoder. The memory is arranged to store a program code. The microprocessor is arranged to execute the program code to control access of the flash memory module. The encoder is arranged to encode multiple data blocks to obtain multiple parity blocks. In addition, the encoder includes a first barrel shifter module, a first calculation circuit, an adjustment circuit, a first circulant convolution calculation circuit, and a second calculation circuit. The first barrel shifter module is arranged to process multiple data blocks to sequentially generate multiple partial parity blocks, wherein the multiple partial parity blocks comprise a first part and a second part, generation time of the first part is earlier than generation time of the second part, and a number of partial parity blocks comprised in the first part is less than a number of partial parity blocks comprised in the second part. The first calculation circuit is coupled to the first barrel shifter module, and is arranged to generate a first calculation result according to the second part. The adjustment circuit is arranged to adjust the first part of the multiple partial parity blocks according to the first calculation result, to generate an adjusted first part. The first circulant convolution calculation circuit is coupled to the adjustment circuit, and is arranged to perform a circulant convolution operation upon the adjusted first part, to generate a first part parity block. The second calculation circuit, coupled to the first circulant convolution calculation circuit, and arranged to generate a second part parity block according to the first part parity block, wherein the first part parity block and the second part parity block act as multiple parity blocks that are generated by the encoder for the multiple data blocks, and the multiple data blocks and the multiple parity blocks are written into a flash memory module.

According to an embodiment of the present invention, an encoder is provided. The encoder includes a barrel shifter module, an adjustment circuit, a circulant convolution calculation circuit, and a calculation circuit. The barrel shifter module is arranged to process multiple data blocks to generate multiple partial parity blocks, wherein the multiple partial parity blocks comprise a first part and a second part, generation time of the first part is earlier than generation time of the second part, and a number of partial parity blocks comprised in the first part is less than a number of partial parity blocks comprised in the second part. The adjustment circuit is arranged to adjust the first part of the multiple partial parity blocks according to the second part, to generate an adjusted first part. The circulant convolution calculation circuit is coupled to the adjustment circuit, and is arranged to perform a circulant convolution operation upon the adjusted first part, to generate a first part parity block. The calculation circuit is coupled to the circulant convolution calculation circuit, and is arranged to generate a second part parity block according to the first part parity block, wherein the first part parity block and the second part parity block act as multiple parity blocks that are generated by the encoder for the multiple data blocks, and the multiple data blocks and the multiple parity blocks are written into a flash memory module.

According to an embodiment of the present invention, a flash memory controller is provided. The flash memory controller is arranged to access a flash memory module, and includes a memory, a microprocessor, and an encoder. The memory is arranged to store a program code. The microprocessor is arranged to execute the program code to control access of the flash memory module. The encoder is arranged to encode multiple data blocks to obtain multiple parity blocks. In addition, the encoder includes a first barrel shifter module, an adjustment circuit, a circulant convolution calculation circuit, and a calculation circuit. The first barrel shifter module is arranged to process the multiple data blocks to generate multiple partial parity blocks, wherein the multiple partial parity blocks comprise a first part and a second part, generation time of the first part is earlier than generation time of the second part, and a number of partial parity blocks comprised in the first part is less than a number of partial parity blocks comprised in the second part. The adjustment circuit is arranged to adjust the first part of the multiple partial parity blocks according to the second part, to generate an adjusted first part. The circulant convolution calculation circuit is coupled to the adjustment circuit, and is arranged to perform a circulant convolution operation upon the adjusted first part, to generate a first part parity block. The calculation circuit is coupled to the circulant convolution calculation circuit, and is arranged to generate a second part parity block according to the first part parity block, wherein the first part parity block and the second part parity block act as multiple parity blocks that are generated by the encoder for the multiple data blocks, and the multiple data blocks and the multiple parity blocks are written into a flash memory.

One of the benefits of the present invention is that, in the encoder of the present invention, under a condition that the parity blocks can be generated assuredly, by dividing the partial parity blocks into two parts for operations, and making a number of partial parity blocks of the first part with earlier generation time less than that of the second part, the hardware required by the circulant convolution calculation in the encoder can be reduced, and the encoder of the present invention can have higher efficiency. In addition, by converting the parity-check matrix to generate an isomorphic matrix, some components in the encoder and the decoder can further be omitted, which can further reduce the manufacturing cost.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram illustrating an isomorphic matrix of the parity-check matrix.

DETAILED DESCRIPTION

Figure 1:
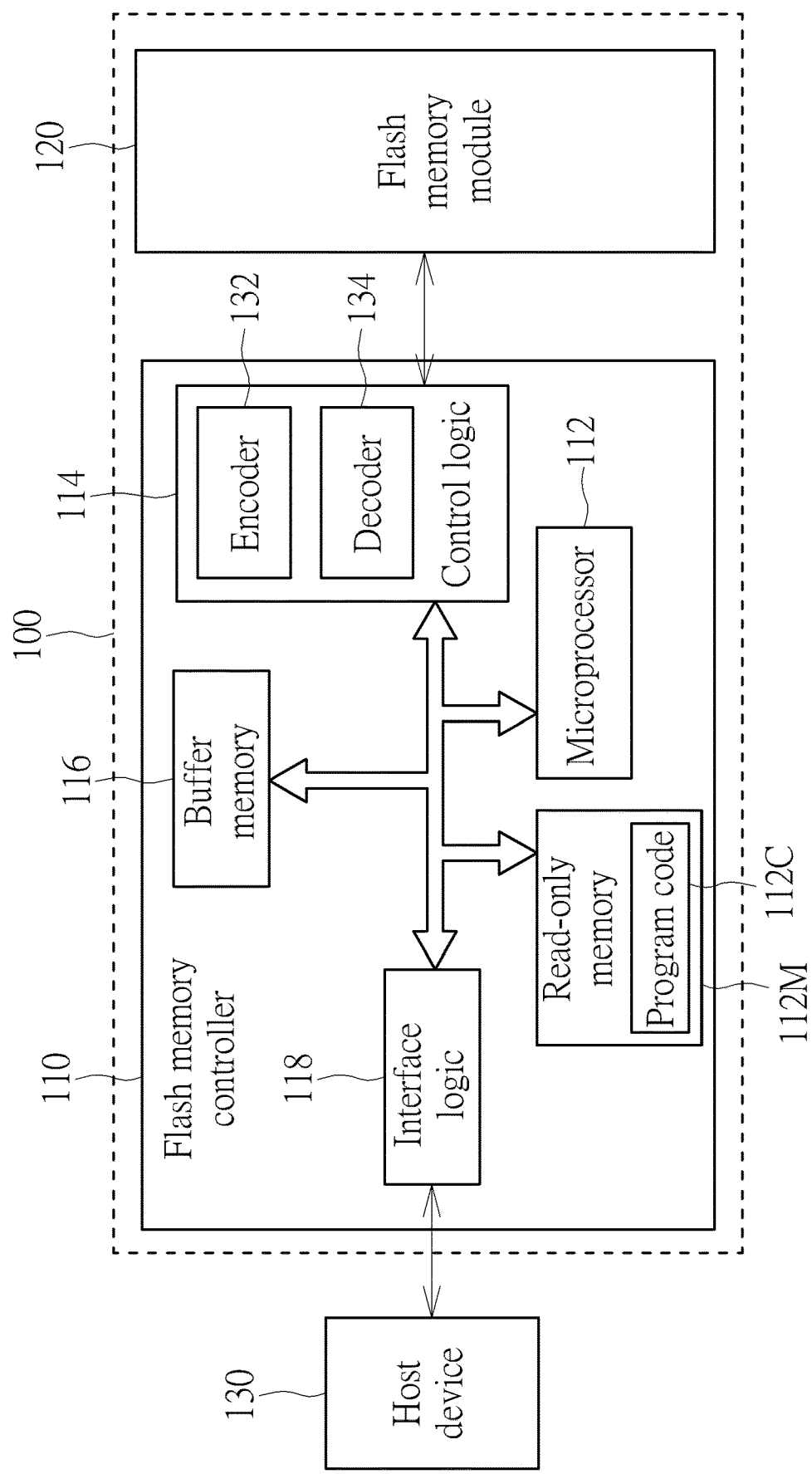
FIG. 1 is a diagram illustrating a memory device according to an embodiment of the present invention.

Please refer to FIG. 1. FIG. 1 is a diagram illustrating a memory device 100 according to an embodiment of the present invention. The memory device 100 may include a flash memory controller 110 and a flash memory module 120, and the flash memory controller 110 is arranged to access the flash memory module 120. In this embodiment, the flash memory controller 110 may include a microprocessor 112, a read-only memory 112M, a control logic 114, a buffer memory 116, and an interface logic 118. The read-only memory 112M may be arranged to store a program code 112C, and the microprocessor 112 may be arranged to execute the program code 112C to control access of the flash memory module 120. The control logic 114 may include an encoder 132 and a decoder 134, wherein the encoder 132 may be arranged to encode data that is written into the flash memory module 120, to generate a corresponding parity (also known as an error correction code (ECC)), and the decoder 134 is arranged to decode data that is read from the flash memory module 120.

In a general situation, the flash memory module 120 may include a plurality of flash memory chips, and each flash memory chip includes a plurality of blocks. A controller (e.g. the flash memory controller 110 that executes the program code 112C through the microprocessor 112) may copy, erase, and merge data for the flash memory module 120 with a block as a unit. In addition, a block can record a specific number of pages, wherein the controller (e.g. the flash memory controller 110 that executes the program code 112C through the microprocessor 112) may perform a data write operation upon the flash memory module 120 with a page as a unit. In other words, a block is the smallest erase unit in the flash memory module 120, and a page is the smallest write unit in the flash memory module 120.

In practice, the flash memory controller 110 that executes the program code 112C through the microprocessor 112 may utilize its own internal components to perform many control operations. For example, the flash memory controller 122 utilizes the control logic 114 to control access of the flash memory module 120 (especially access of at least one block or at least one page), utilizes the buffer memory 116 to perform a required buffering operation, and utilizes the interface logic 118 to communicate with a host device 130.

In one embodiment, the memory device 100 may be a portable memory device such as a memory card which conforms to one of the SD/MMC, CF, MS and XD specifications, and the host device 130 is another electronic device able to be connected to the memory device 100, such as a cellphone, a laptop, a desktop computer, etc. In another embodiment, the memory device 100 can be arranged in an electronic device, such as a cellphone, a laptop or a desktop computer. At this time, the host device 130 can be a processor of the electronic device.

Figure 2:
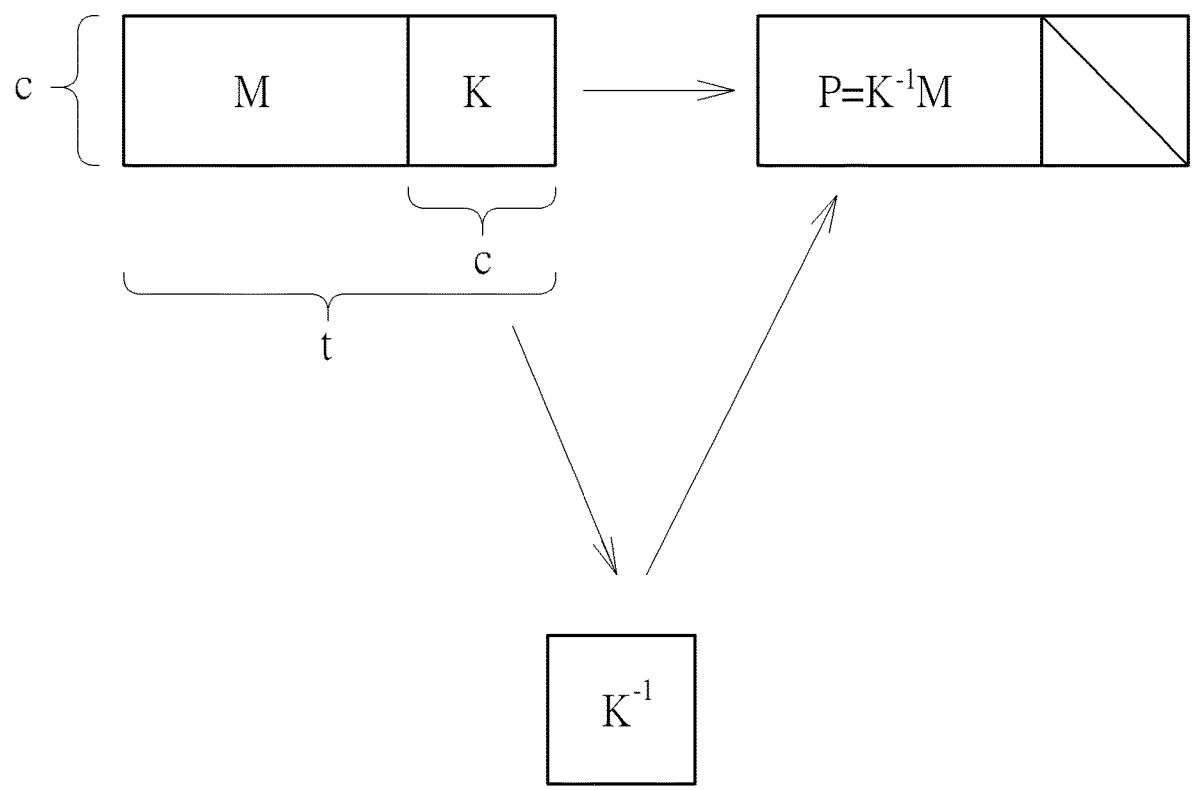
FIG. 2 is a diagram illustrating a parity-check matrix and a parity-generation matrix.

In this embodiment, the encoder 132 is a low-density parity check (LDPC) code encoder, and may generate a corresponding parity according to data from the host device 130, wherein the generated parity is required to conform to a parity-check matrix. Specifically, please refer to FIG. 2. FIG. 2 is a diagram illustrating a parity-check matrix and a parity-generation matrix. As shown in FIG. 2, it is assumed that the parity-check matrix is a c*t matrix (e.g. c=5 and t=48), and the parity-check matrix can be divided into a left-side c*(t−c) matrix M and a right-side c*c matrix K. In order to find out a parity-generation matrix corresponding to the parity-check matrix, an inverse matrix $K^{-1}$ of the matrix K may be found out first. Afterwards, the inverse matrix $K^{-1}$ is multiplied by the matrix M to generate a matrix P, and a transpose matrix of the matrix P can act as the parity-generation matrix. In other words, after the transpose matrix of the matrix P is found out, the encoder 132 can multiply data from the host device 130 by the transpose matrix of the matrix P to obtain the parity corresponding to the data, and multiply the data and the parity by the parity-check matrix to determine whether the encoding is correct. For example, if the multiplication result is equal to "0", it is determined that the encoding is correct; and if the multiplication result is not equal to "0", it is determined that the encoding is incorrect. After it is determined that the encoding is correct, the data and the corresponding parity will be written into a page in the flash memory module 120.

Under some situations, however, the inverse matrix $K^{-1}$ may not be found out easily. As a result, the encoder 132 will need to perform multiple matrix multiplication operations, compensation operations, and/or adjustment operations to obtain a matrix that is similar to the inverse matrix $K^{-1}$, for finding out the parity-generation matrix to generate the parity. To address this issue, the present invention provides one circuit architecture, so that the encoder 132 can complete its operation under a condition that the hardware cost is saved as much as possible. It should be noted that the encoding process in the encoder 132 involves many complex mathematical operations. However, since the focus of the present invention is on the design of the circuit structure, the details of the relevant matrix content and the derivation process are omitted here.

Figure 3:
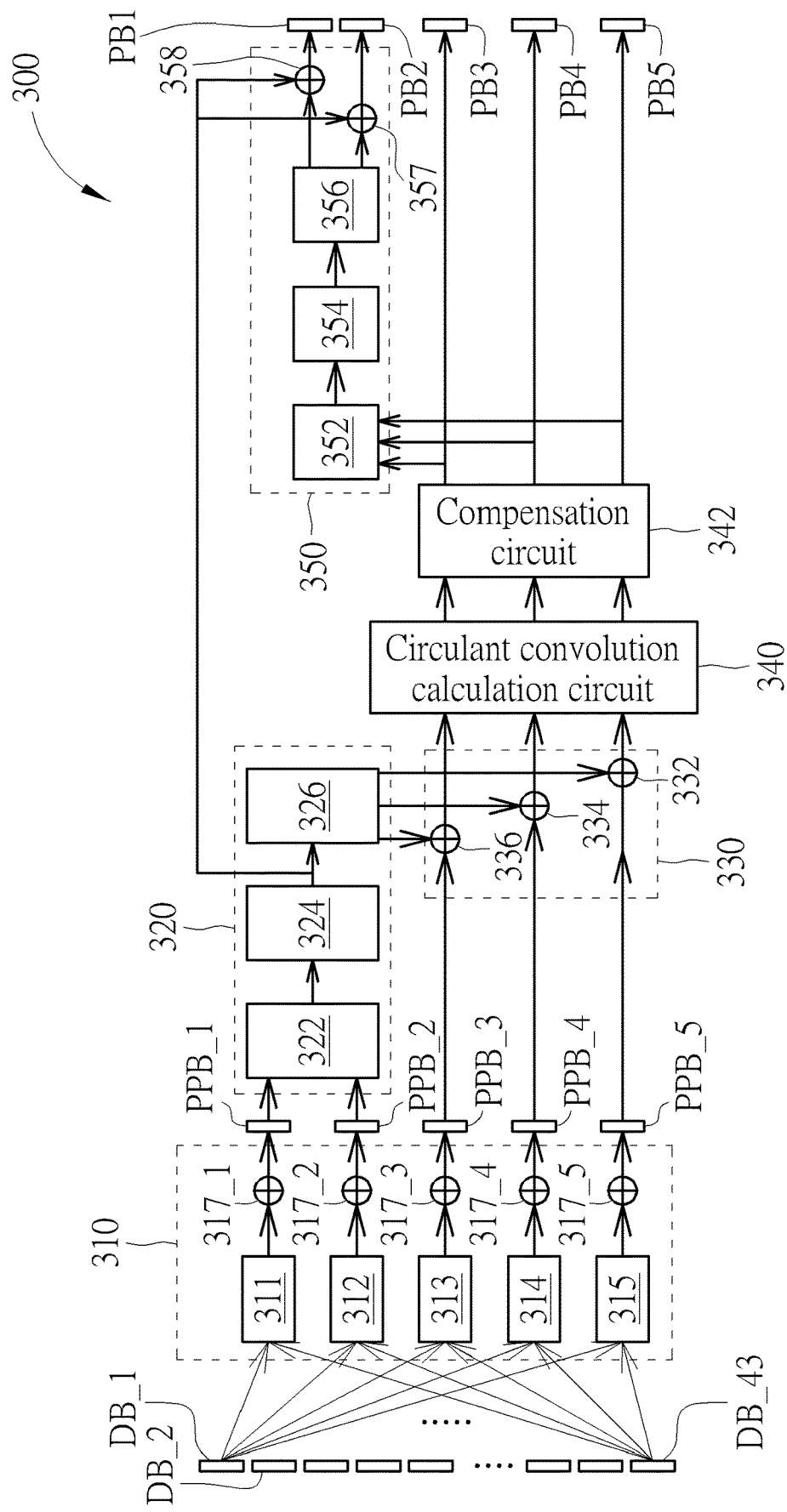
FIG. 3 is a diagram illustrating an encoder according to an embodiment of the present invention.

Please refer to FIG. 3. FIG. 3 is a diagram illustrating an encoder 300 according to an embodiment of the present invention, wherein the encoder 132 shown in FIG. 1 may be implemented by the encoder 300. As shown in FIG. 3, the encoder 300 may include a barrel shifter module 310, a first calculation circuit 320, an adjustment circuit 330, a circulant convolution calculation circuit 340, a compensation circuit 342, and a second calculation circuit 350. In this embodiment, the barrel shifter module 310 may include multiple barrel shifters 311, 312, 313, 314, and 315 and multiple accumulation circuits 317_1-317_5. The first calculation circuit 320 may include a circulant convolution calculation circuit 322, a compensation circuit 324, and a barrel shifter module 326. The adjustment circuit 330 may include multiple accumulation circuits 332, 334, and 336. The second calculation circuit 350 may include a barrel shifter module 352, a circulant convolution calculation circuit 354, a compensation circuit 356, and an output circuit that includes 2 accumulation circuits 357 and 358. In this embodiment, the encoder 300 may divide data from the host device 130 into multiple data blocks (e.g. 43 data blocks DB_1-DB_43 in this embodiment), and encode the 43 data blocks DB_1-DB_43 to generate multiple parity blocks (e.g. parity blocks PB_1-PB_5 in this embodiment). It should be noted that the size of a data block is the same as that of a parity block, and the size of the data block may be determined by designers (e.g. 192*192 bits).

In the operation of the encoder 300, the barrel shifter module 310 may sequentially receive and process the data blocks DB_1-DB_43 to generate multiple partial parity blocks PPB_1-PPB_5. Specifically, the barrel shifter 311 may sequentially perform a shift operation upon the data blocks DB_1-DB_43, and the accumulation circuit 317_1 may sum up 43 shifted data blocks to obtain the partial parity block PPB_1. The barrel shifter 312 may sequentially perform a shift operation upon the data blocks DB_1-DB_43, and the accumulation circuit 317_2 may sum up 43 shifted data blocks to obtain the partial parity block PPB_2. Similarly, the barrel shifters 313, 314, and 315 may sequentially perform a shift operation upon the data blocks DB_1-DB_43, and the accumulation circuits 317_3, 317_4, and 317_5 may sum up 43 shifted data blocks to obtain the partial parity blocks PPB_3, PPB_4, and PPB_5, respectively.

The partial parity blocks PPB_1-PPB_5 may be divided into two parts to undergo different processes, wherein the first part may include 2 partial parity blocks PPB_1 and PPB_2, and the second part may include 3 partial parity blocks PPB_3-PPB_5. In the operation of the first calculation circuit 320, the circulant convolution calculation circuit 322 may perform a circulant convolution operation upon the partial parity blocks PPB_1 and PPB_2, to generate 2 intermediate blocks. The compensation circuit 324 may be an optional component, and may be arranged to compensate the 2 intermediate blocks output by the circulant convolution calculation circuit 322. The barrel shifter module 326 may be arranged to process the 2 intermediate blocks to generate 2 calculation result blocks. In this embodiment, since the barrel shifter module 326 generates 3 calculation result blocks according to the 2 intermediate blocks, the barrel shifter module 326 may include 6 barrel shifters (2*3=6).

The accumulation circuits 332, 334, and 336 in the adjustment circuit 330 may add the 3 calculation result blocks generated by the barrel shifter module 326 to the second part of the partial parity blocks (i.e. the partial parity blocks PPB_3-PPB_5), to generate multiple adjusted partial parity blocks.

The circulant convolution calculation circuit 340 may perform a circulant convolution operation upon the multiple adjusted partial parity blocks, and generate the parity blocks PB_3-PB_5 through the compensation circuit 342. It should be noted that the compensation circuit 342 may be an optional component. That is, in a situation that compensation is not required, the compensation circuit 342 may be removed from the encoder 300, which will not affect the operation of the encoder 300.

In the operation of the second calculation circuit 350, the barrel shifter module 352 may process the parity blocks PB_3-PB_5 to generate 2 processed blocks. The circulant convolution calculation circuit 354 may perform a circulant convolution operation upon the 2 processed blocks, to generate 2 output blocks. The compensation circuit 356 may be an optional component, and may be arranged to compensate the 2 output blocks output by the circulant convolution calculation circuit 354. The accumulation circuits 357 and 358 may add the intermediate blocks generated by the circulant convolution calculation circuit 322 or the compensation circuit 324 to the 2 output blocks generated by the circulant convolution calculation circuit 354 or the compensation circuit 356, respectively, to generate the parity blocks PB_1 and PB_2. In this embodiment, since the barrel shifter module 352 generates the 2 processed blocks according to the 3 parity blocks PB_3-PB_5, the barrel shifter module 352 may include 6 barrel shifters (3*2=6).

After the parity blocks PB_1-PB_5 are generated, the encoder 300 may multiply the data blocks DB_1-DB_43 and the parity blocks PB_1-PB_5 by the parity-check matrix, to determine whether the parity blocks PB_1-PB_5 are correct. If the parity blocks PB_1-PB_5 are correct, the flash memory controller 100 may write the data blocks DB_1-DB_43 and the parity blocks PB_1-PB_5 into a page of a block in the flash memory module 120.

In the circuit architecture shown in FIG. 3, the barrel shifter module 310 may match the matrix M shown in FIG. 2, and the first calculation circuit 320, the adjustment circuit 330, the circulant convolution calculation circuit 340, the compensation circuit 342, and the second calculation circuit 350 may be arranged to generate an inverse matrix that is similar to the inverse matrix $K^{-1}$ shown in FIG. 2. In this way, the parity blocks PB_1-PB_5 can be generated under a situation that the inverse matrix $K^{-1}$ cannot be found out. In addition, the encoder 300 may have 3 circulant convolution calculation circuits 322, 340, and 354, wherein the circulant convolution calculation circuit 322 performs 2*2 circulant matrix/block multiplications, the circulant convolution calculation circuit 340 performs 3*3 circulant matrix/block multiplications, the circulant convolution calculation circuit 354 performs 2*2 circulant matrix/block multiplications, and the total number of circulant matrix/block multiplications of the encoder 300 is 17 (4+9+4=17). As a result, since the encoder 300 only needs to perform 17 circulant matrix/block multiplication operations to generate 5 parity blocks, the hardware cost of the encoder 300 can be reduced.

In this embodiment, in practice, the encoder 300 sequentially processes the data blocks DB_1-DB_43, and the partial parity blocks PPB_1-PPB_5 are generated sequentially. That is, the generation time of the partial parity blocks PPB_1 and PPB_2 of the first part is earlier than that of the partial parity blocks PPB_3-PPB_5 of the second part. As a result, by setting the number of the partial parity blocks of the first part to be smaller than that of the second part, the execution efficiency of the encoder 300 can be improved. Specifically, by processing the partial parity blocks PPB_1 and PPB_2 of the first part with the earlier generation time through the first calculation circuit 320, the calculation circuit 320 can generate the 3 calculation result blocks earlier for the adjustment circuit 330, which can improve the overall efficiency.

Figure 4:
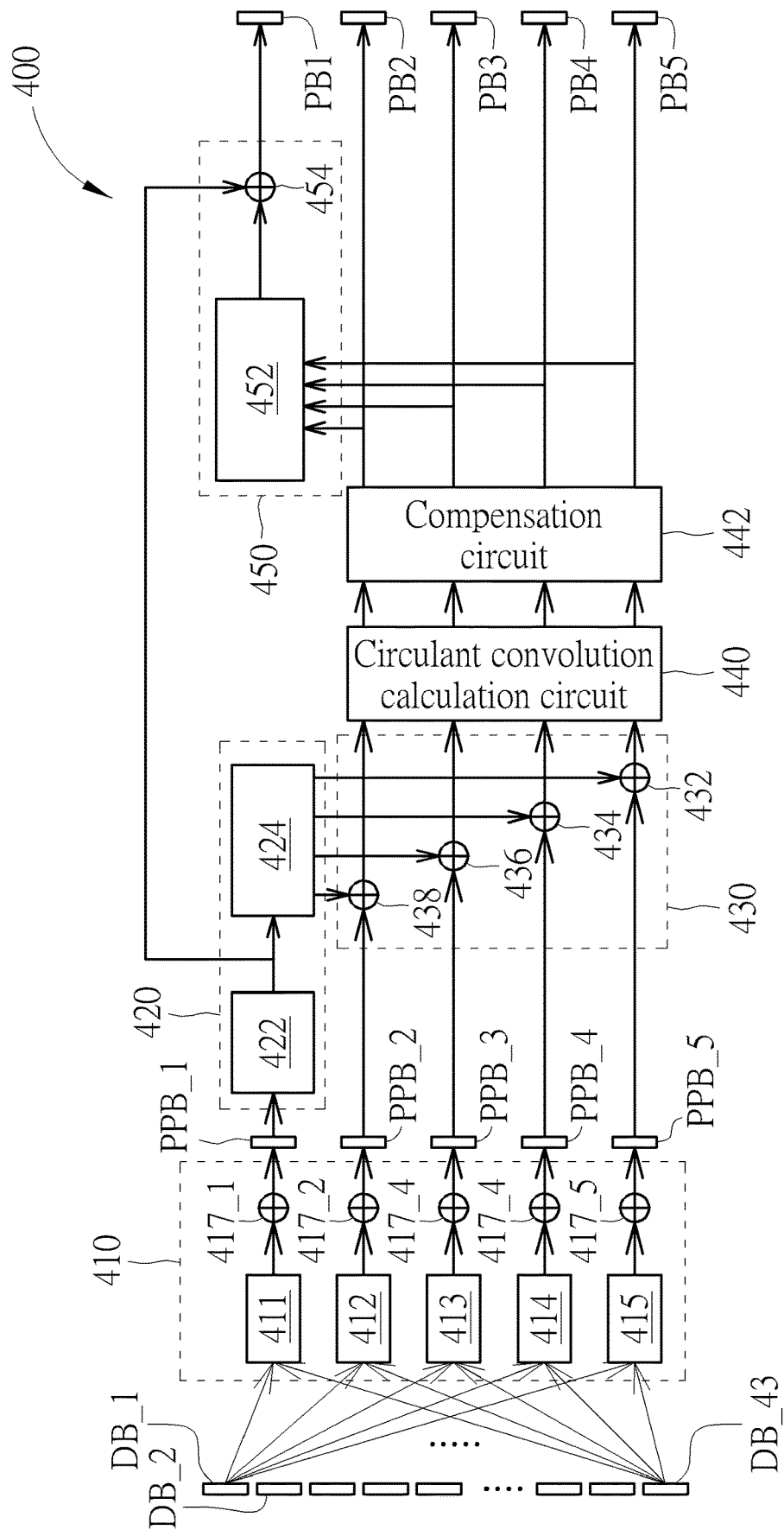
FIG. 4 is a diagram illustrating an encoder according to another embodiment of the present invention.

Please refer to FIG. 4. FIG. 4 is a diagram illustrating an encoder 400 according to another embodiment of the present invention, wherein the encoder 132 shown in FIG. 1 may be implemented by the encoder 400. As shown in FIG. 4, the encoder 400 may include a barrel shifter module 410, a first calculation circuit 420, an adjustment circuit 430, a circulant convolution calculation circuit 440, a compensation circuit 442, and a second calculation circuit 450. In this embodiment, the barrel shifter module 410 may include multiple barrel shifters 411, 412, 413, 414, and 415 and multiple accumulation circuits 417_1-417_5. The first calculation circuit 420 may include 2 barrel shifter modules 422 and 424. The adjustment circuit 430 may include multiple accumulation circuits 432, 434, 436, and 438. The second calculation circuit 450 may include a barrel shifter module 452 and an output circuit 454. The encoder 400 may divide data from the host device 130 into multiple data blocks (e.g. 43 data blocks DB_1-DB_43), and encode the 43 data blocks DB_1-DB_43 to generate multiple parity blocks (e.g. 5 parity blocks PB_1-PB_5). It should be noted that the size of a data block is the same as that of a parity block, and the size of the data block may be determined by designers (e.g. 192*192 bits).

In the operation of the encoder 400, the barrel shifter module 410 may process the data blocks DB_1-DB_43 to generate multiple partial parity blocks PPB_1-PPB_5. Specifically, the barrel shifter 411 may perform a shift operation upon the data blocks DB_1-DB_43, respectively, and the accumulation circuit 417_1 may sum up 43 shifted data blocks to obtain the partial parity block PPB_1. The barrel shifter 412 may perform a shift operation upon the data blocks DB_1-DB_43, respectively, and the accumulation circuit 417_2 may sum up 43 shifted data blocks to obtain the partial parity block PPB_2. Similarly, the barrel shifters 413, 414, and 415 may perform a shift operation upon the data blocks DB_1-DB_43, and the accumulation circuits 417_3, 417_4, and 417_5 may sum up 43 shifted data blocks to obtain the partial parity blocks PPB_3, PPB_4, and PPB_5, respectively.

The partial parity blocks PPB_1-PPB_5 may be divided into two parts to undergo different processes, wherein the first part may include only one partial parity block PPB_1, and the second part may include 4 partial parity blocks PPB_2-PPB_5. In the operation of the first calculation circuit 420, the barrel shifter module 422 may perform a shift operation upon the partial parity block PPB_1, to generate an intermediate block. The barrel shifter module 424 may process the intermediate block to generate 4 calculation result blocks.

The accumulation circuits 432, 434, 436, and 438 in the adjustment circuit 430 may add the 4 calculation result blocks generated by the barrel shifter module 424 to the partial parity blocks PPB_2-PPB_5, respectively, to generate multiple adjusted partial parity blocks.

The circulant convolution calculation circuit 440 may perform a circulant convolution operation upon the multiple adjusted partial parity blocks, and generate the parity blocks PB_2-PB_5 through the compensation circuit 442. It should be noted that the compensation circuit 442 may be an optional component. That is, in a situation that compensation is not required, the compensation circuit 442 may be removed from the encoder 400, which will not affect the operation of the encoder 400.

In the operation of the second calculation circuit 450, the barrel shifter module 452 may process the parity blocks PB_1-PB_4 to generate a processed block. The output circuit 454 may add the intermediate block generated by the barrel shifter module 422 to the processed block generated by the barrel shifter module 452, to generate the parity block PB_1.

After the parity blocks PB_1-PB_5 are generated, the encoder 400 may multiply the data blocks DB_1-DB_43 and the parity blocks PB_1-PB_5 by the parity-check matrix, to determine whether the parity blocks PB_1-PB_5 are correct. If the parity blocks PB_1-PB_5 are correct, the flash memory controller 100 may write the data blocks DB_1-DB_43 and the parity blocks PB_1-PB_5 into a page of a block in the flash memory module 120.

In the circuit architecture shown in FIG. 4, the barrel shifter module 410 may match the matrix M shown in FIG. 2, and the first calculation circuit 420, the adjustment circuit 430, the circulant convolution calculation circuit 440, the compensation circuit 442, and the second calculation circuit 450 may be arranged to generate an inverse matrix that is similar to the inverse matrix $K^{-1}$ shown in FIG. 2. In this way, the parity blocks PB_1-PB_5 can be generated under a situation that the inverse matrix $K^{-1}$ cannot be found out. In addition, the encoder 400 may have only one circulant convolution calculation circuit 440, wherein the circulant convolution calculation circuit 440 performs 4*4 circulant matrix/block multiplications. As a result, since the encoder 400 only needs to perform 16 circulant matrix/block multiplication operations to generate 5 parity blocks, the hardware cost of the encoder 400 can be effectively reduced.

In this embodiment, in practice, the encoder 400 sequentially processes the data blocks DB_1-DB_43, and the partial parity blocks PPB_1-PPB_5 are generated sequentially. That is, the generation time of the partial parity block PPB_1 of the first part is earlier than that of the partial parity blocks PPB_2-PPB_5 of the second part. As a result, by setting the number of the partial parity blocks of the first part to be smaller than that of the second part, the execution efficiency of the encoder 400 can be improved. Specifically, by processing the partial parity block PPB_1 of the first part with the earlier generation time through the first calculation circuit 420, the calculation circuit 420 can generate the 4 calculation result blocks earlier for the adjustment circuit 430, which can improve the overall efficiency.

In one embodiment, designers may convert the parity-check matrix to generate an isomorphic matrix, so that the circuit architecture of the encoder 132 may be further simplified. Specifically, please refer to FIG. 5. FIG. 5 is a diagram illustrating an isomorphic matrix of the parity-check matrix. As shown in FIG. 5, the left-side matrix is the matrix K in the parity-check matrix, wherein each symbol σ in the left-side matrix is arranged to represent a submatrix, and a superscript of each symbol σ represents how many bits the submatrix is rotated (e.g. "$\sigma^{136}$" represents the submatrix is rotated by 136 bits). In this embodiment, the matrix K may perform conversion to make each of the submatrices of the topmost row and the leftmost column become an identity matrix. Specifically, designers may adjust a number of rotated bits of each submatrix in each row according to a number of rotated bits of submatrices in the first column (e.g. a number of rotated bits of each submatrix in the first row is subtracted by "136"), so that each submatrix in the first column of the matrix K becomes an identity matrix (i.e. "$\sigma^0$"). Afterwards, designers may adjust a number of rotated bits of each submatrix in each column according to a number of rotated bits of a submatrix in the first row (e.g. a number of rotated bits of each submatrix in the second column is subtracted by a number of rotated bits of a submatrix in the first row), so that each submatrix in the first row of the matrix K becomes an identity matrix (i.e. "$\sigma^0$"). The right-side matrix shown in FIG. 5 is an isomorphic matrix that is generated by converting the matrix K of the parity-check matrix, wherein the superscripts $S_{00}$-$S_{33}$ indicate numbers of rotated bits of the isomorphic matrix.

Figure 6:
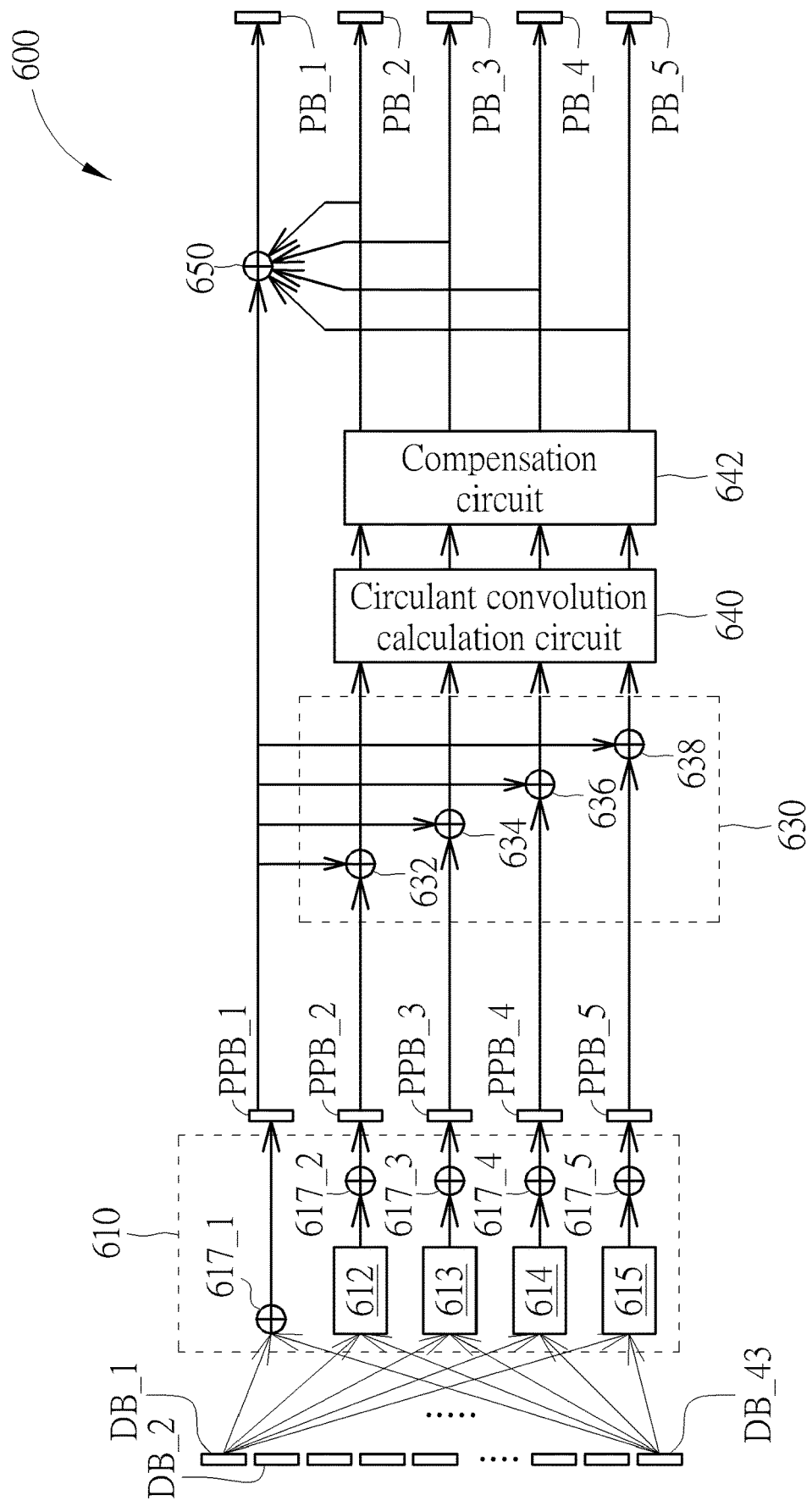
FIG. 6 is a diagram illustrating an encoder according to still another embodiment of the present invention.

Please refer to FIG. 6. FIG. 6 is a diagram illustrating an encoder 600 according to still another embodiment of the present invention, wherein the encoder 132 shown in FIG. 1 may be implemented by the encoder 600. As shown in FIG. 6, the encoder 600 may include a barrel shifter module 610, an adjustment circuit 630, a circulant convolution calculation circuit 640, a compensation circuit 642, and a calculation circuit 650. In this embodiment, the barrel shifter module 610 may include multiple barrel shifters 612, 613, 614, and 615 and multiple accumulation circuits 617_1-617_5. The encoder 600 may divide data from the host device 130 into multiple data blocks (e.g. 43 data blocks DB_1-DB_43), and encode the 43 data blocks DB_1-DB_43 to generate multiple parity blocks (e.g. 5 parity blocks PB_1-PB_5). It should be noted that the size of a data block is the same as that of a parity block, and the size of the data block may be determined by designers (e.g. 192*192 bits).

In the operation of the encoder 600, the barrel shifter module 610 may process the data blocks DB_1-DB_43 to generate multiple partial parity blocks PPB_1-PPB_5. The accumulation circuit 617_1 may directly sum up the data blocks DB_1-DB_43 to generate the partial parity blocks PPB_1. The barrel shifter 612 may perform a shift operation upon the data blocks DB_1-DB_43, respectively, and the accumulation circuit 417_1 may sum up 43 shifted data blocks to obtain the partial parity block PPB_2. Similarly, the barrel shifters 613, 614, and 615 may perform a shift operation upon the data blocks DB_1-DB_43, and the accumulation circuits 617_3, 617_4, and 617_5 may sum up 43 shifted data blocks to obtain the partial parity blocks PPB_3, PPB_4, and PPB_5, respectively.

The partial parity blocks PPB_1-PPB_5 may be divided into two parts to undergo different processes, wherein the first part may include only one partial parity block PPB_1, and the second part may include 4 partial parity blocks PPB_2-PPB_5. The accumulation circuits 632, 634, 636, and 638 in the adjustment circuit 630 may add the partial parity block PPB_1 to the partial parity blocks PPB_2-PPB_5, respectively, to generate multiple adjusted partial parity blocks.

The circulant convolution calculation circuit 640 may perform a circulant convolution operation upon the multiple adjusted partial parity blocks, and generate the parity blocks PB_2-PB_5 through the compensation circuit 642. It should be noted that the compensation circuit 642 may be an optional component. That is, in a situation that compensation is not required, the compensation circuit 642 may be removed from the encoder 600, which will not affect the operation of the encoder 600.

The calculation circuit 650 may add the partial parity block PPB_1 to the parity blocks PB_2-PB_5, to generate the parity block PB_1.

After the parity blocks PB_1-PB_5 are generated, the encoder 600 may multiply the data blocks DB_1-DB_43 and the parity blocks PB_1-PB_5 by the parity-check matrix, to determine whether the parity blocks PB_1-PB_5 are correct. If the parity blocks PB_1-PB_5 are correct, the flash memory controller 100 may write the data blocks DB_1-DB_43 and the parity blocks PB_1-PB_5 into a page of a block in the flash memory module 120.

In the circuit architecture shown in FIG. 6, the barrel shifter module 610 may match the matrix M shown in FIG. 2, and the adjustment circuit 630, the circulant convolution calculation circuit 640, the compensation circuit 642, and the calculation circuit 650 may be arranged to generate an inverse matrix that is similar to the inverse matrix $K^{-1}$ shown in FIG. 2. In this way, the parity blocks PB_1-PB_5 can be generated under a situation that the inverse matrix $K^{-1}$ cannot be found out. In addition, the encoder 600 may have only one circulant convolution calculation circuit 640, wherein the circulant convolution calculation circuit 640 performs 4*4 circulant matrix/block multiplications. As a result, since the encoder 600 only needs to perform 16 circulant matrix/block multiplication operations to generate 5 parity blocks, the hardware cost of the encoder 600 can be effectively reduced. In addition, compared with the encoder 400 shown in FIG. 4, the encoder 600 does not include the first calculation circuit 420 and some components in the second calculation circuit 450, and the barrel shifter module 610 has one less barrel shifter than the barrel shifter module 410. As a result, the cost can be further reduced.

Figure 7:
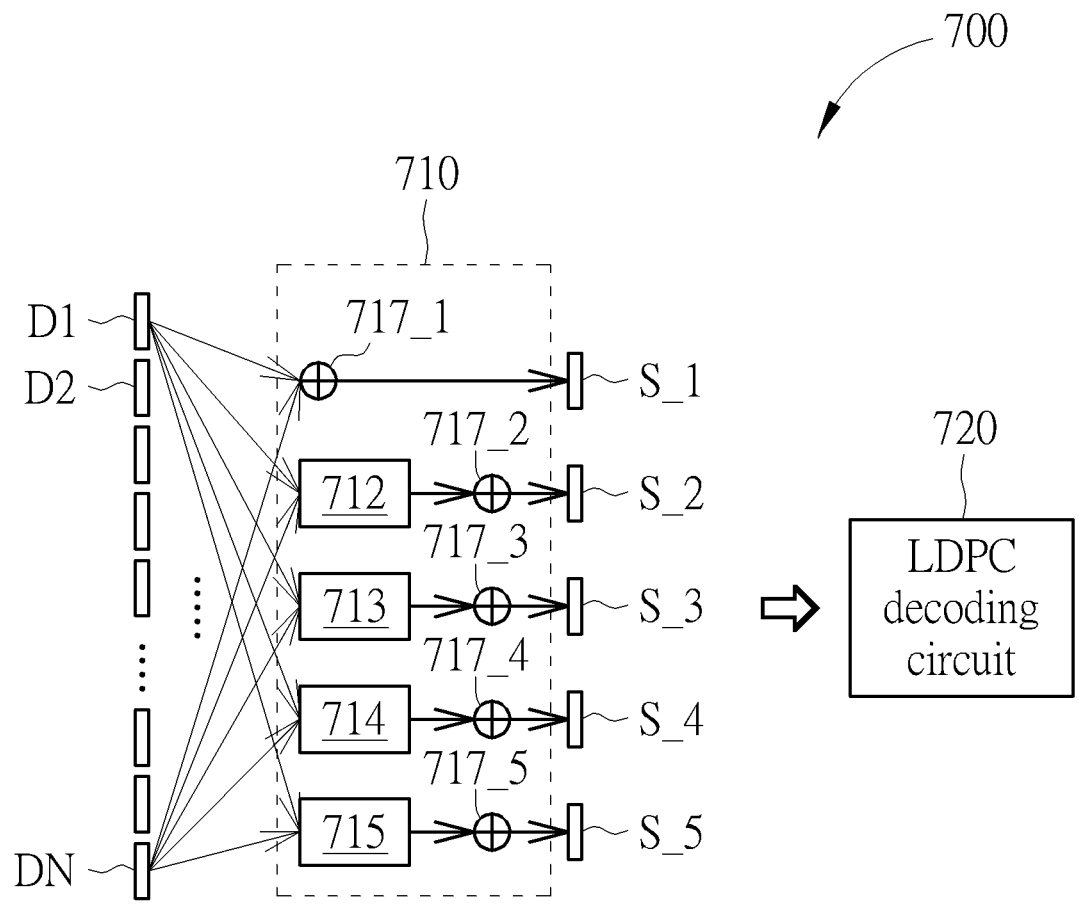
FIG. 7 is a diagram illustrating a decoder according to an embodiment of the present invention.

In addition, if the encoder 600 shown in FIG. 6 is adopted, the circuit architecture of the decoder 134 can be further simplified to reduce the manufacturing cost. Please refer to FIG. 7. FIG. 7 is a diagram illustrating a decoder 700 according to an embodiment of the present invention, wherein the decoder 134 shown in FIG. 1 may be implemented by the decoder 700. As shown in FIG. 7, the decoder 700 may include multiple barrel shifters 712-715, multiple accumulation circuits 717_1-717_5, and an LDPC decoding circuit 720. In this embodiment, the decoder 700 may be arranged to: receive read data from the flash memory module 120; divide the read data into multiple read data blocks D1-DN; perform calculation upon the read data blocks D1-DN to generate multiple decoding syndromes S_1-S_5; and transmit the decoding syndromes S_1-S_5 to the LDPC decoding circuit 720 for decoding, to correct error bits in the read data.

In the operation of the decoder 700, the accumulation circuit 717_1 may directly sum up the read data blocks D1-DN to obtain the decoding syndrome S_1. The barrel shifter 712 may perform a shift operation upon the read data blocks D1-DN, respectively, and the accumulation circuit 717_2 may sum up multiple shifted read data blocks to obtain the decoding syndrome S 2. Similarly, the barrel shifters 713, 714, and 715 may perform a shift operation upon the read data blocks D1-DN, respectively, and the accumulation circuits 717_3, 717_4, and 717_5 may sum up multiple shifted read data blocks to obtain the decoding syndromes S_3-S_5.

In addition, since the process of generating the decoding syndrome S_1 does not need to utilize the barrel shifter, the circuit architecture of the decoder 700 can have fewer components, which results in lower manufacturing cost.

In summary, in the encoder of the present invention, under a condition that the parity blocks can be generated assuredly, by dividing the partial parity blocks into two parts for operations, and making a number of partial parity blocks of the first part with earlier generation time less than that of the second part, the hardware required by the circulant convolution calculation in the encoder can be reduced, and the encoder of the present invention can have higher efficiency. In addition, by converting the parity-check matrix to generate an isomorphic matrix, some components in the encoder and the decoder can further be omitted, which can further reduce the manufacturing cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A flash memory controller, arranged to access a flash memory module, and comprising:
    a memory, arranged to store a program code;
    a microprocessor, arranged to execute the program code to control access of the flash memory module; and
    an encoder, arranged to encode multiple data blocks to obtain multiple parity blocks, wherein the encoder comprises:
        a first barrel shifter module, arranged to process the multiple data blocks to generate multiple partial parity blocks, wherein the multiple partial parity blocks comprise a first part and a second part, generation time of the first part is earlier than generation time of the second part, and a number of partial parity blocks comprised in the first part is less than a number of partial parity blocks comprised in the second part;
        an adjustment circuit, arranged to adjust the second part of the multiple partial parity blocks according to the first part, to generate an adjusted second part;
        a circulant convolution calculation circuit, coupled to the adjustment circuit, and arranged to perform a circulant convolution operation upon the adjusted second part, to generate a second part parity block; and
        a calculation circuit, coupled to the circulant convolution calculation circuit, and arranged to generate a first part parity block according to the second part parity block;
    wherein the first part parity block and the second part parity block act as multiple parity blocks that are generated by the encoder for the multiple data blocks, and the multiple data blocks and the multiple parity blocks are written into a flash memory;
    wherein both of the multiple data blocks and the multiple parity blocks are multiplied by a parity-check matrix, to determine whether the multiple parity blocks are correct only if the multiple parity blocks are determined to be correct, the multiple data blocks and the multiple parity blocks are written into the flash memory;
    wherein each submatrix in the first column and the first row of the parity-check matrix is an identity matrix;
    wherein the flash memory controller further comprises a decoder, and the decoder comprises:
        a second barrel shifter module and multiple accumulation circuits, arranged to process multiple read data blocks read from the flash memory module, to generate multiple decoding syndromes, wherein a number of barrel shifters comprises in the second barrel shifter module is less than a number of the multiple accumulation circuits, and the number of barrel shifters comprises in the second barrel shifter module is less than a number of the multiple decoding syndromes.

2. The flash memory controller of claim 1, wherein the first part comprises only one partial parity block.

* * * * *